United States Patent [19]

Miller et al.

[11] Patent Number: 5,483,186
[45] Date of Patent: Jan. 9, 1996

[54] PUSH-PULL OPTICAL MODULATOR DRIVER CIRCUIT

[75] Inventors: David A. B. Miller, Fair Haven; Ted K. Woodward, Lincroft, both of N.J.

[73] Assignee: AT&T Corp., Murray Hill, N.J.

[21] Appl. No.: 238,562

[22] Filed: May 5, 1994

[51] Int. Cl.⁶ .................................... H03K 3/00
[52] U.S. Cl. ................... 327/108; 327/514; 250/214 LS
[58] Field of Search .................................... 327/108, 109, 327/110, 111, 112, 514; 250/208.1, 214 LS

[56] References Cited

U.S. PATENT DOCUMENTS

| | | | |
|---|---|---|---|
| 3,655,988 | 4/1972 | Nakamura et al. | 250/209 |
| 4,322,817 | 3/1982 | Kuster | 363/26 |
| 4,689,793 | 8/1987 | Liu et al. | 372/8 |
| 4,754,132 | 6/1988 | Hinton et al. | 250/211 J |
| 4,985,621 | 1/1991 | Aull et al. | 250/213 A |
| 5,055,668 | 10/1991 | French | 250/208.2 |
| 5,289,015 | 2/1994 | Chirovsky et al. | 257/21 |
| 5,329,113 | 7/1994 | Taylor et al. | 250/214 LS |
| 5,389,776 | 2/1995 | Woodward | 250/214 LS |

Primary Examiner—Timothy P. Callahan
Assistant Examiner—Kenneth B. Wells

[57] ABSTRACT

A drive circuit for increasing the voltage range applied across optical modulators in a transmitter stage of an optical communication system. The circuit comprises a first switch and a second switch connected thereto. The first switch is responsive to a first input signal and has a maximum voltage drop equal to a first reference voltage. The second switch is responsive to a second input signal and has a maximum voltage drop equal to a second reference voltage. A modulator is connected between the first and second switches so that, depending on the values of the first and second input signals, the maximum voltage drop across the modulator will be a value greater than either the first or the second reference voltage.

22 Claims, 2 Drawing Sheets

PUSH-PULL OPTICAL MODULATOR DRIVER CIRCUIT

BACKGROUND OF THE INVENTION

1. Field of the Invention

This invention pertains to driver circuits for driving multiple quantum well modulators in high density electronic chips having a combination of electronic and optic devices. More particularly, the present invention pertains to driver circuits for increasing the voltage range across multiple quantum well modulators while limiting the maximum voltage applied across the transistors in the modulator driver circuit.

2. Description of the Related Art

Electronic chips having a combination of electronic and optic circuits for use in, among other things, optic communication systems in computers, are known. Typically, such electronic chips employ at the transmitter stage driver circuits which are comprised of field effect transistor (FET) configurations for driving normal incidence multiple quantum well (MQW) modulators, as described in U.S. Pat. No. 5,289,015. The MQW modulators output optical signals which are detected by an optical receiver. The optical signals generated by an MQW modulator are related to the voltage applied across the terminals of the modulator via the electric field generated by that voltage within the MQW region, as described in U.S. Pat. No. 4,716,449. Thus, for example, in one mode of operation if a low voltage is applied across an MQW modulator, most of the normal incident light will be reflected, thus corresponding to a logic "0". If a high voltage is applied across an MQW modulator, most of the normal incident light will be absorbed, thus corresponding to a logic "1".

When using MQW modulators in such driver transmitter circuits, it is desirable to increase the voltage range across the MQW modulators because this will permit the use of modulators having superior optical performance as compared to devices of the same class whose operating voltage is restricted. For example, in addition to an increased tolerance to temperature variation, an increased contrast between the optical signals corresponding to a logic "0" and those corresponding to a logic "1" can be obtained. This translates into a more precise and higher certainty distinction between the dark and light optical signals corresponding to a logic "1" and a logic "0". However, increasing the voltage range across an MQW modulator has several drawbacks. Specifically, if the increased maximum voltage across the MQW modulator is beyond the breakdown voltage of conventional FETs, the circuit may fail due to catastrophic damage to the FETs. On the other hand, if FETs having increased breakdown voltages are used, FET performance will be reduced and manufacturing yield may be compromised. Thus, it is desirable to have an increased voltage range across the MQW modulators in a transmitter driver circuit without increasing the voltages applied to the FETs in the associated driver circuit.

Accordingly, it is an object of the present invention to provide a transmitter driver circuit that applies an increased voltage range to the modulator while limiting the maximum voltage applied across the associated transistors.

It is a further object of the invention to provide a differential transmitter driver circuit for comparing the optical signal generated by a first modulator to the optical signal generated by a second modulator.

Other objects and features as well as additional details of the present invention will become apparent from the following detailed description and annexed drawings of the presently preferred embodiments thereof, when considered in conjunction with the associated drawings.

SUMMARY OF THE INVENTION

The present invention relates to a push-pull driver circuit for driving an optical modulator. The circuit comprises a first switch means operating at a first reference voltage and responsive to a first input signal having a high or low value, and a second switch means operating at a second reference voltage and responsive to a second input signal having a high or low value. The second switch means is connected to the first switch means at a junction which is maintained at a third reference voltage. An optical modulator operating in a range of voltages having a maximum voltage value and a minimum voltage value and having a first terminal and a second terminal is connected to the first and second switch means such that the first terminal is connected to the first switch means and the second terminal is connected to the second switch means. Depending on the value of the first input signal, the first switch means applies the first or third reference voltage to the first terminal and, depending on the value of the second input signal, the second switch means applies the second or third reference voltage to the second terminal. Thus, the maximum voltage applied across the modulator is greater than the magnitude of the first reference voltage and the second reference voltage.

In the preferred embodiment, third and fourth switch means are added to comprise a differential circuit. The third and fourth switch means are connected to the terminals of a second modulator in a like manner to that of the first and second switch means, and are responsive to third and fourth input signals, respectively. The third and fourth switch means vary the voltage across the second modulator from a minimum value to a maximum value that is greater than the magnitude of the first reference voltage and the second reference voltage. In this preferred embodiment, the input signals are selected so that when the first modulator is at a maximum voltage, the second modulator is at a minimum voltage, and when the second modulator is at a maximum voltage, the first modulator is at a minimum voltage.

BRIEF DESCRIPTION OF THE DRAWINGS

In the drawings, wherein like reference numerals denote like elements throughout the several views.

DETAILED DESCRIPTION OF THE PREFERRED EMBODIMENT

Figure 1:
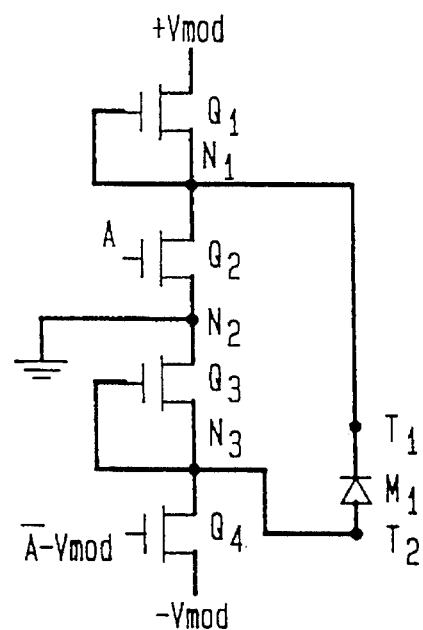
FIG. 1 is a schematic diagram of a quantum well modulator driver circuit constructed in accordance with the present invention.

Referring now to the drawings, and initially to FIG. 1 thereof, a schematic diagram of an optical quantum well modulator driver circuit is schematically depicted. The circuit is comprised of four transistors $Q_1$, $Q_2$, $Q_3$, $Q_4$, here field effect transistors (FETs), and a quantum well modulator $M_1$ having terminals $T_1$ and $T_2$. As shown, terminal $T_1$ is connected to the drain of transistor $Q_2$ and terminal $T_2$ is connected to the drain of transistor $Q_4$. The source of $Q_2$ and the drain of $Q_3$ are connected to each other and form a junction at node $N_2$. Transistor $Q_1$ is operated at a first reference voltage of $+V_{mod}$ and transistor $Q_4$ is operated at a second reference voltage of $-V_{mod}$. Node $N_2$ is maintained at a third reference voltage which, in the preferred embodiment, is held at ground. Also as shown, the gate of transistor $Q_2$ receives a first input signal (A) and the gate of transistor $Q_4$ receives a second input signal $V_{mod}$), wherein $\overline{A}$ is the logical compliment of A. Transistor pairs $Q_1$, $Q_2$ and $Q_3$, $Q_4$ form first and second switching means, respectively, for applying voltages to $M_1$ in a manner more fully described below.

The circuit of FIG. 1 operates in the following manner. When first input signal A is high relative to ground, transistor $Q_2$ will turn on, thereby pulling node $N_1$ to ground and causing the voltage at terminal $T_1$ to assume the value of the third reference voltage which, as explained above, is ground in the preferred embodiment. Simultaneously with first input signal A going high, second input signal $\overline{A}-V_{mod}$ is low relative to $-V_{mod}$. Thus, $Q_4$ remains in its off state. Since $Q_3$ is always on, when $Q_4$ is off node $N_3$ is also at ground, thereby causing the voltage at terminal $T_2$ to be at ground potential. Thus, it should be apparent that when first input signal A is high, the voltage drop across modulator $M_1$ at 0 volts.

Transistor $Q_1$, like transistor $Q_3$, is also always on, i.e. operating in a low-resistance state. Thus, when first input signal A is low, transistor $Q_2$ turns off, thereby causing the voltage at node $N_1$ and terminal $T_1$ to be approximately $V_{mod}$. When first input signal A is low, second input signal $\overline{A}-V_{mod}$ is high, thereby turning on transistor $Q_4$ which changes the voltage at node $N_3$ and terminal $T_2$ to $-V_{mod}$. Therefore, if A is low, the voltage drop across modulator $M_1$ is approximately $2V_{mod}$. It will accordingly be recognized that this circuit effectively limits the voltage across any of the transistors to a maximum of $V_{mod}$ while allowing a maximum voltage drop of $2V_{mod}$ across modulator $M_1$. As explained above, this result is particularly beneficial because it permits the use of modulators whose optical performance is superior to similar devices restricted to operation at a lower voltage.

Figure 2:
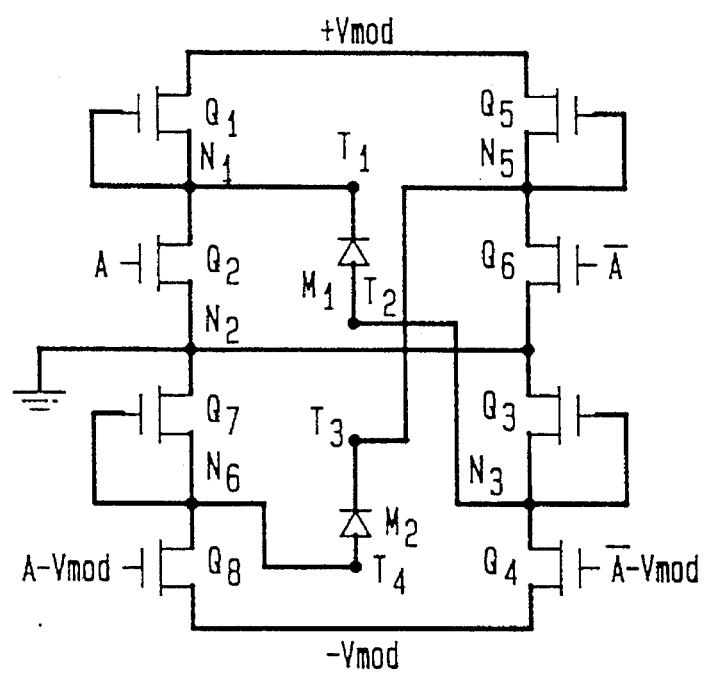
FIG. 2 is a schematic diagram of a differential quantum well modulator driver circuit.

Attention is now directed to FIG. 2 which depicts a differential modulator drive circuit in accordance with the present invention. This is a symmetrical circuit whereby the lefthand portion of the circuit is responsive to input signals A and $A-V_{mod}$ while the right-hand portion is responsive to input signals $\overline{A}$ and $\overline{A}-V_{mod}$. Specifically, the gates of transistors $Q_2$ and $Q_8$ receive input signals A and $A-V_{mod}$, respectively, and the gates of transistors $Q_6$ and $Q_4$ receive input signals $\overline{A}$ and $\overline{A}-V_{mod}$, respectively. Transistors $Q_1$, $Q_2$, $Q_3$ and $Q_4$, along with modulator $M_1$, are configured in an identical manner to that of FIG. 1. However, this circuit differs from the FIG. 1 arrangement in that it further includes transistors $Q_5$, $Q_6$, $Q_7$, $Q_8$ and a second modulator $M_2$.

As shown in FIG. 2, the source of transistor $Q_5$ and the drain of transistor $Q_6$ are joined at node $N_5$ which is connected to terminal $T_3$ of modulator $M_2$. Likewise, transistors $Q_7$ and $Q_8$ are similarly joined at node $N_6$, which is connected to terminal $T_4$ of modulator $M_2$. Transistors $Q_1$ and $Q_5$ are operated at a first reference voltage of $+V_{mod}$ and transistors $Q_4$ and $Q_8$ are operated at a second reference voltage of $-V_{mod}$.

When first input signal A is high, transistor $Q_2$ will turn on, thereby pulling node $N_1$ to ground and causing the reference voltage (zero volts) to appear at terminal $T_1$ of modulator $M_1$. While input signal A is high, second input signal $\overline{A}-V_{mod}$ is low which causes transistor $Q_4$ to remain off. This causes node $N_3$ to be pulled to ground and causes zero volts to appear at terminal $T_2$. Thus, the voltage drop across modulator $M_1$ will be zero volts when input signal A is high.

Also when input signal A is high, third input signal $\overline{A}$—which is the complement of A—will be low, thus causing transistor $Q_6$ to remain off. This creates a voltage of $+V_{mod}$ at node $N_5$ which will also appear at terminal $T_3$ of modulator $M_2$. In addition, fourth input signal $A-V_{mod}$ will be high and turn on transistor $Q_8$ which creates a voltage at terminal $T_4$ of approximately $-V_{mod}$. Thus, it will be seen that when input signal A is high the voltage drop across modulator $M_2$ has a value of $2V_{mod}$ and the voltage drop across modulator $M_1$ is zero. Conversely, when first input signal A is low, the opposite result occurs—i.e. the voltage across modulator $M_1$ is $2V_{mod}$ and the voltage across modulator $M_2$ is zero.

The circuit of FIG. 2 allows the bright and dark contrasts of the modulators $M_1$ and $M_2$ to be easily detected because the optical signals generated by the respective modulators $M_1$, $M_2$ call be compared one to the other. Thus, the differential modulator driver circuit of FIG. 2 advantageously enables ready comparison of the high signal to the low signal so as to determine whether what is believed to be the high signal is, indeed, at a high state.

Figure 3:
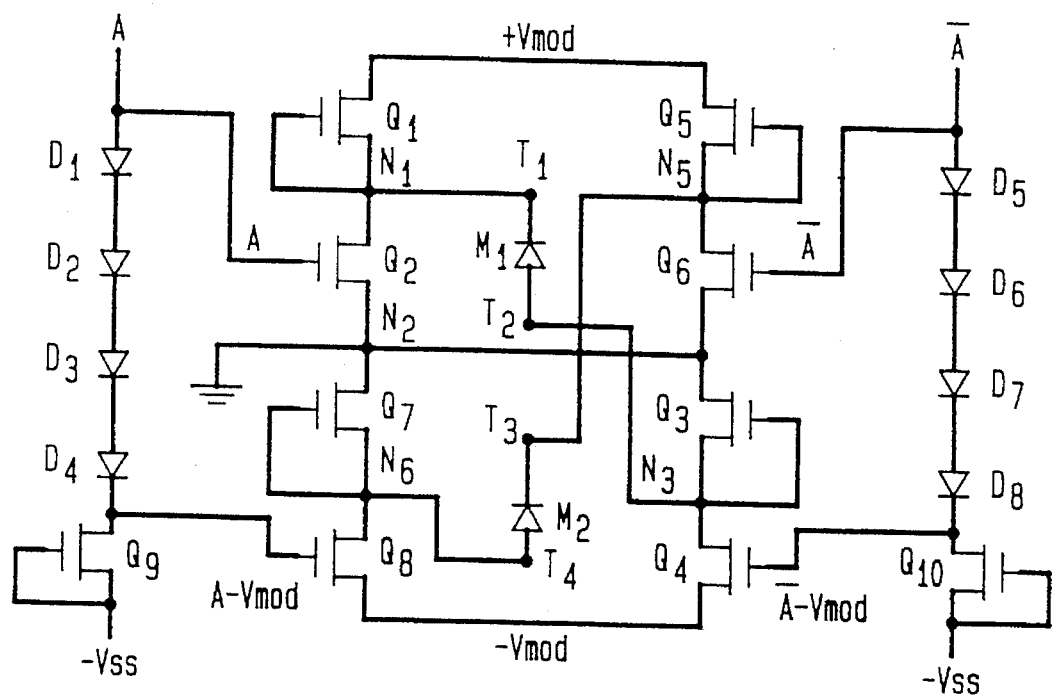
FIG. 3 is a schematic diagram of the circuit of FIG. 2 modified to include diode configurations for deriving the complementary input signals.

Turning now to FIG. 3, the differential modulator driver circuit of FIG. 2 is shown modified to further incorporate two diode chains or configurations. The first diode configuration is comprised of diodes $D_1$, $D_2$, $D_3$, $D_4$ and transistor $Q_9$, and the second diode configuration is comprised of diodes $D_5$, $D_6$, $D_7$, $D_8$ and transistor $Q_{10}$. The first diode configuration is configured for passing to the left-hand portion of the circuit the first and third input signals, A and $A-V_{mod}$. Thus, diodes $D_1$, $D_2$, $D_3$ and $D_4$ are chosen to create a voltage drop sufficient to equal the value of $V_{mod}$ and thereby provide the third input signal $A-V_{mod}$. Likewise, at the right-hand portion of the circuit, diodes $D_5$, $D_6$, $D_7$ and $D_8$ are also selected to create a voltage drop of $V_{mod}$ so that the second input signal that is applied to the gate of transistor $Q_4$ will be $\overline{A}-V_{mod}$. Thus, although the FIG. 3 arrangement operatively requires four different input signals, only two of those signals, namely A and $\overline{A}$, need to be expressly provided with the first and second diode configurations generating the remaining two input signals, $A-V_{mod}$ and $\overline{A}-_{mod}$.

Figure 4:
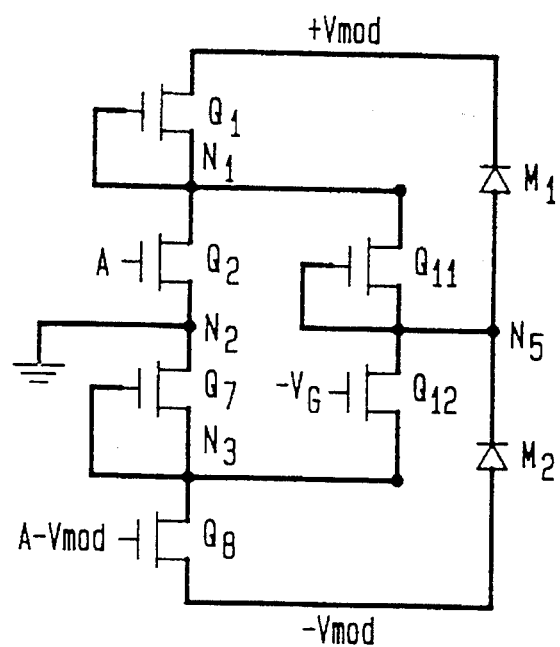
FIG. 4 is a schematic diagram of another differential quantum well modulator driver circuit.

Referring now to FIG. 4, a most preferred differential modulator driver circuit is there shown. In this final circuit arrangement, transistor $Q_{12}$ has a fixed gate voltage $-V_G$ having a value slightly greater than the value of $-V_{mod}$. Thus, by way of example, if $V_{mod}$ is 4 volts so that $-V_{mod}$ is $-4$ volts, $-V_G$ may be $-3$ volts. It is noted that $-V_G$ may be externally applied or may be derived from one of the reference voltages. Each modulator $M_1$, $M_2$ has one of its terminals tied to $+V_{mod}$ and $-V_{mod}$, respectively. When first input signal A is low so that second input signal $A-V_{mod}$ is also low, transistors $Q_2$, $Q_8$ and $Q_{12}$ are off and transistor $Q_{11}$ is on. This places a voltage of $V_{mod}$ at node $N_5$ and causes the voltage drop across modulator $M_1$ to be zero volts and the voltage drop across modulator $M_2$ to be $2V_{mod}$. When the opposite state or value of the first input signal is applied—i.e. A is high and $A-V_{mod}$ is more positive than $-V_{mod}$—transistors $Q_2$, $Q_8$ and $Q_{12}$ are one and transistor $Q_{11}$ is off. In that case, the voltage at node $N_5$ is $-V_{mod}$ which causes the voltage drop across modulator $M_1$ to be $2V_{mod}$ and the voltage drop across modulator $M_2$ to be zero. Accordingly, as in the circuit of FIG. 2, the FIG. 4 arrangement simultaneously generates a bright and a dark signal from the two modulators, thus readily permitting comparison of one to the other so as to determine which signal corresponds to a high and which signal corresponds to a low.

It should be pointed out that although the circuit of FIG. 4 achieves the same result as the circuit of FIG. 2 in that both simultaneously generate two opposite-state optical signals, the circuit of FIG. 4 provides additional benefits. Specifically, unlike the FIG. 2 arrangement which requires the external provision of two separate input signals—namely, A and $\overline{A}$—the circuit of FIG. 4 requires only one input signal (A). The second input signal for the FIG. 4 circuit, namely $A-V_{mod}$, is derived by utilizing a diode configuration similar to that depicted in FIG. 3. In addition, only 6 transistors are required for the circuit of FIG. 4, whereas 8 transistors are required for the FIG. 2 arrangement. Since the circuit of FIG. 4 utilizes fewer transistors, it correspondingly—and advantageously—occupies less area on a chip containing the circuit. Finally, it is clear that the principles employed in the circuit of FIG. 4 are readily extensible to additional stages which may yield even higher voltages.

In a most preferred embodiment, the transistors are implemented using GaAs FETs designed for operation at a maximum voltage of 4 volts, i.e. $V_{mod}$=4 volts. Thus, and as should by now be apparent to one having ordinary skill in the art, the inventive driver circuits described herein create across the modulators a maximum voltage drop which is greater than the maximum voltage applied to the transistors. This higher voltage creates an extended and enhanced contrast between the opposite-state dark and light optical signals generated by the modulators.

Although I have herein shown and described the currently preferred embodiments of the invention, various changes and modifications of those expressly described embodiments will be readily apparent to those of ordinary skill in the art who read the foregoing description. In addition, it is further contemplated that silicon transistors may be used as a substitute for GaAs transistors and that the transistors used may be capable of safely operating at voltages above or other than 4 volts. Thus, the preferred embodiments and examples described herein are for illustrative purposes only and are not to be construed as limiting the scope of the present invention, which is properly delineated only in the appended claims.

What is claimed is:

1. A push-pull driver circuit for driving an optical modulator, comprising:

a first switch means for connection to a first reference voltage and controlled by a first input signal applied thereto, said first input signal having one of a high and a low value;

a second switch means for connection to a second reference voltage and controlled by a second input signal applied thereto, said second input signal having the other of a high and a low value relative to the value of said first input signal, said second switch means being connected to said first switch means for forming a junction that is maintained at a third reference voltage; and at least a first optical modulator having first and second terminals said optical modulator producing a modulating function when a drive voltage in a range defined between a maximum value and a minimum value is applied to said first and second terminals;

wherein said first terminal is connected to said first switch means for applying a first portion of said drive voltage to said first terminal so that said first switch means selectively applies a selected one of said first and said third reference voltages to said first terminal selected on the basis of whether said first input signal applied to said first switch means is a high value or a low value; and wherein said second terminal is connected to said second switch means for applying a second portion of said drive voltage to said second terminal so that said second switch means selectively applies a selected one of said second and said third reference voltages to said second terminal selected on the basis of whether said second input signal applied to said second switch means is a high value or a low value, so that the maximum value of the drive voltage is greater in magnitude than the magnitudes of each of said first reference voltage and said second reference voltage.

2. The circuit of claim 1, wherein said first switch means comprises a first plurality of field effect transistors and wherein said second switch means comprises a second plurality of field effect transistors.

3. The circuit of claim 2, wherein said first switch means and said second switch means are connected to each other in a cascode manner.

4. The circuit of claim 3, wherein said first input signal is applied to a gate of one of the field effect transistors in said first plurality, and wherein said second input signal is applied to a gate of one of the field effect transistors in said second plurality.

5. The circuit of claim 4, wherein said third reference voltage has a value between the values of said first and said second reference voltages.

6. The circuit of claim 5, further comprising:

a third switch means for connection to said first reference voltage and controlled by a third input signal applied thereto, said third input signal having one of a high and a low value;

a fourth switch means for connection to said second reference voltage and controlled by a fourth input signal applied thereto, said fourth input signal having the other of a high and a low value relative to the value of said third input signal, and said fourth switch means being connected to said third switch means for forming a junction that is maintained at said third reference voltage; and a second optical modulator having first and second terminals, said second optical modulator producing a modulating function when a second drive voltage in said range defined between said maximum value and said minimum value is applied to said first and second terminals of said second modulator;

wherein said first terminal is connected to said third switch means for applying a first portion of said second drive voltage to said first terminal so that said third switch means selectively applies a selected one of said first and said third reference voltages to said first terminal of said second modulator selected on the basis of whether said third input signal applied to said third switch means is a high value or a low value; and wherein said second terminal is connected to said fourth switch means for applying a second portion of said second drive voltage to said second terminal so that said fourth switch means selectively applies a selected one of said second and said third reference voltages to said second terminal of said second modulator selected on the basis of whether said fourth input signal applied to said fourth switch means is a high value or a low value, so that said maximum value of the second drive voltage is greater in magnitude than the magnitudes of each of said first reference voltage and said second reference voltage and so that when the first drive voltage is at said minimum voltage value, the second drive voltage is at said maximum voltage value.

7. The circuit of claim 6, wherein said third switch means comprises a third plurality of field effect transistors, and wherein said fourth switch means comprises a fourth plurality of field effect transistors.

8. The circuit of claim 7, wherein said third switch means and said fourth switch means are connected to each other in a cascode manner.

9. The circuit of claim 8, wherein said third input signal is applied to a gate of one of the field effect transistors in said third plurality, and wherein said fourth input signal is applied to a gate of one of the field effect transistors is said fourth plurality.

10. The circuit of claim 9, wherein said third reference voltage has a value between the values of said first and said second reference voltages.

11. The circuit of claim 1, further comprising:

a third switch means for connection to said first reference voltage and controlled by a third input signal applied thereto, said third input signal having one of a high and a low value;

a fourth switch means for connection to said second reference voltage and controlled by a fourth input signal applied thereto, said fourth input signal having the other of a high and a low value relative to the value of said third input signal, and said fourth switch means being connected to said third switch means for forming a junction that is maintained at said third reference voltage; and a second optical modulator having first and second terminals, said second optical modulator producing a modulating function when a second drive voltage in said range defined between said maximum value and said minimum value is applied to said first and second terminals of said second modulator;

wherein said first terminal is connected to said third switch means for applying a first portion of said second drive voltage to said first terminal so that said third switch means selectively applies a selected one of said first and said third reference voltages to said first terminal of said second modulator selected on the basis of whether said third input signal applied to said third switch means is a high value or a low value; and wherein said second terminal is connected to said fourth switch means for applying a second portion of said second drive voltage to said second terminal so that said fourth switch means selectively applies a selected one of said second and said third reference voltages to said second terminal of said second modulator selected on the basis of whether said fourth input signal applied to said fourth switch means is a high value or a low value, so that said maximum value of the second drive voltage is greater in magnitude than the magnitudes of each of said first reference voltage and said second reference voltage and so that when the first drive voltage is at said minimum voltage value, the second drive voltage is at said maximum voltage value.

12. The circuit of claim 11, wherein said first switch means comprises a first plurality of field effect transistors and wherein said second switch means comprises a second plurality of field effect transistors.

13. The circuit of claim 12, wherein said first switch means and said second switch means are connected to each other in a cascode manner.

14. The circuit of claim 13, wherein said first input signal is applied to a gate of one of the field effect transistors in said first plurality, and wherein said second input signal is applied to a gate of one of the field effect transistors in said second plurality.

15. The circuit of claim 14, wherein said third reference voltage has a value between the values of said first and said second reference voltages.

16. The circuit of claim 11, further comprising first means for generating said fourth input signal from said first input signal and second means for generating said third input signal from said second input signal.

17. A push-pull differential driver circuit for driving a pair of optical modulators, comprising:

a first switch means for connection to a first reference voltage and controlled by a first input signal applied thereto, said first input signal having one of a high and a low value;

a second switch means for connection to a second reference voltage and controlled by a second input signal applied thereto, said second input signal having the other of a high and a low value relative to the value of said first input signals said second switch means being connected to said first switch means for forming a junction that is maintained at a third reference voltage;

a third switch means for connection to a fixed voltage having a value greater than the value of said second reference voltage, said third switch means also being connected to and controlled by said first and second switch means;

a first optical modulator having a first terminal for connection to a source of said first reference voltage and a second terminal connected to said third switch means, said first optical modulator producing a modulating function when a first drive voltage in a first range defined between a first minimum voltage value and a first maximum voltage value greater in magnitude than the magnitude of said first reference voltage is applied to said second terminal by said third switch means; and a second optical modulator having a first terminal connected to said third switch means and a second terminal for connection to a source of said second reference voltage, said second optical modulator producing a modulating function when a second drive voltage in a second range defined between a second minimum voltage value and a second maximum voltage value greater in magnitude than the magnitude of said second reference voltage is applied to said first terminal by said third switch means so that when said first and second input signals are high, the first drive voltage across said first modulator is at said first maximum voltage value and the second drive voltage across said second modulator is at said second minimum voltage value, and so that when said first and said second input signals are low, the second drive voltage across said second modulator is at said second maximum voltage value and the first drive voltage across said first modulator is at said first minimum voltage value.

18. The circuit of claim 17, wherein said first, second and third switch means each comprise a plurality of field effect transistors.

19. The circuit of claim 18, wherein said first switch means and said second switch means are connected to each other in a cascode manner.

20. The circuit of claim 19, wherein said first input signal is applied to a gate of one of the field effect transistors in said first plurality, and wherein said second input signal is applied to a gate of one of the field effect transistors in said second plurality.

21. The circuit of claim 20, wherein said third reference voltage has a value between the values of said first and said second reference voltages.

22. The circuit of claim 17, further comprising means for generating said second input signal from said first input signal.

* * * * *